United States Patent
Han et al.

(10) Patent No.: US 7,382,591 B2
(45) Date of Patent: Jun. 3, 2008

(54) CASCODE PROTECTED NEGATIVE VOLTAGE SWITCHING

(75) Inventors: Bi Han, Shanghai (CN); Daniel Chu, Folsom, CA (US); Mase Taub, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 11/133,648

(22) Filed: May 20, 2005

(65) Prior Publication Data

US 2006/0267414 A1 Nov. 30, 2006

(51) Int. Cl.
*H02H 9/00* (2006.01)
(52) U.S. Cl. ............................................. 361/56
(58) Field of Classification Search ................. 361/56
See application file for complete search history.

(56) References Cited

U.S. PATENT DOCUMENTS 4,967,103 A * 10/1990 Dikken et al. ................ 326/34
6,014,041 A * 1/2000 Somasekhar et al. ........ 326/115
6,809,386 B2 * 10/2004 Chaine et al. .............. 257/368

OTHER PUBLICATIONS

Chu, "Dual Mode Negative Voltage Switching", U.S. Appl. No. 11/069,175, filed Mar. 1, 2005.

* cited by examiner

*Primary Examiner*—Stephen W. Jackson
(74) *Attorney, Agent, or Firm*—Trop, Pruner & Hu, P.C.

(57) ABSTRACT

A double cascode protected switchable voltage source may be used to selectively provide positive or negative voltage sources, for example, to a flash memory. The positive supply may be connected through a PMOS pass device to a first cascode protection device. A negative supply may be connected through an NMOS pass device and an NMOS cascode protection device to an output. The circuits may be designed so that exceeding snapback limits and gate aided drain breakdown are less likely.

30 Claims, 5 Drawing Sheets

US 7,382,591 B2

CASCODE PROTECTED NEGATIVE VOLTAGE SWITCHING

BACKGROUND

This invention relates generally to the field of semiconductor integrated circuits, and, more particularly, to negative switch circuits.

Various integrated circuits use negative voltages to perform certain operations. For example, flash memory devices may use a negative voltage as high as −9 volts to erase data stored on the flash memory cells. By maximizing the amount of negative voltage that can be applied to the flash memory cells, the overall performance of the flash memory device is typically improved. The performance of flash memory devices may be improved by reducing the amount of time it takes to erase the data stored in the flash memory cells. The flash memory may also use relatively low negative voltages, as low as −0.25 volts for example.

These negative voltages may be generated by negative charge pumps. Since the negative voltages are only needed at specific times, negative switches may be used to switch the supplied voltages.

Thus, there is a need for other ways to provide negative voltage switching.

DETAILED DESCRIPTION

Figure 1:
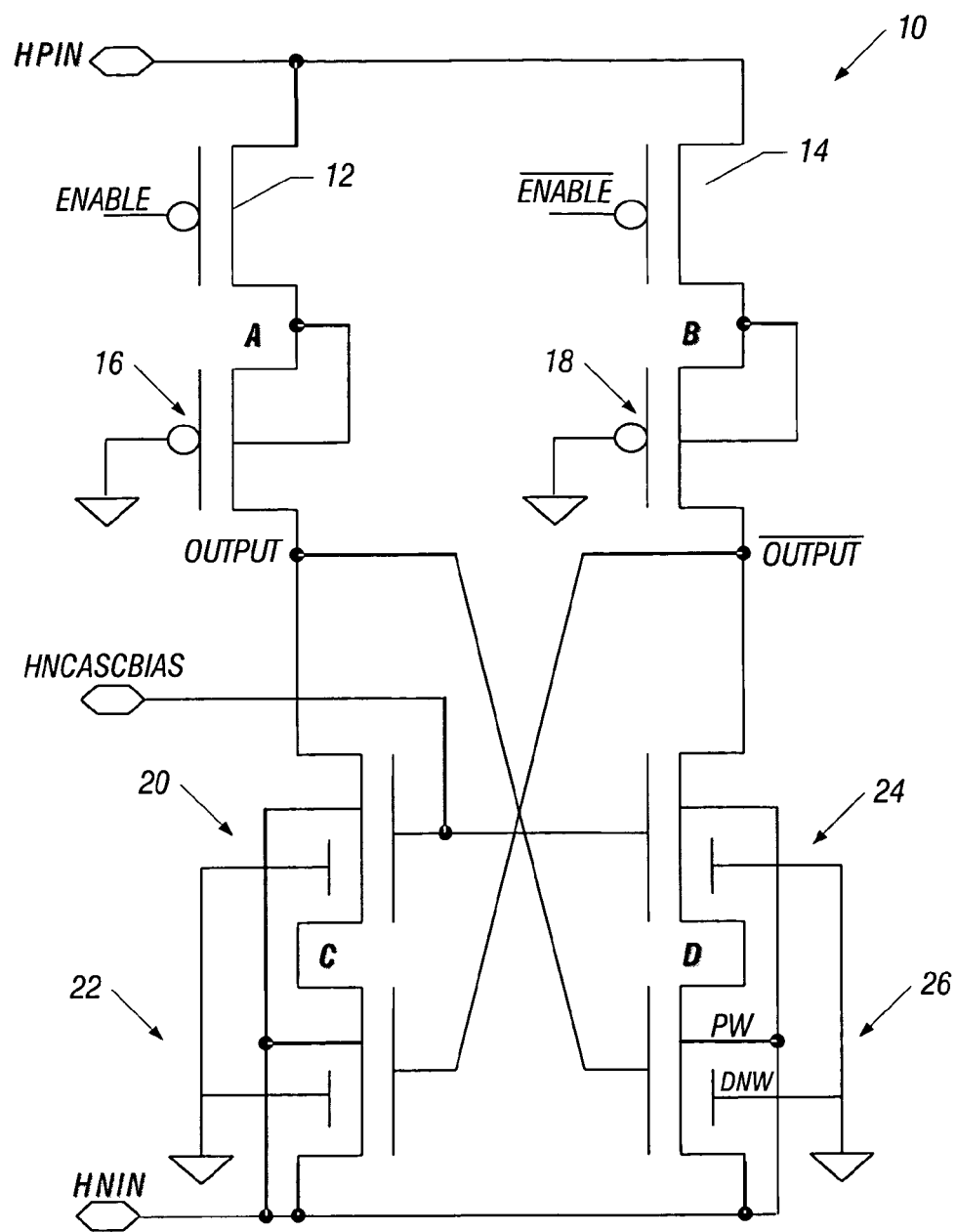
FIG. 1 is a schematic view of a negative voltage switch in accordance with one embodiment of the present invention.

Referring to FIG. 1, a negative switch 10 may switch a relatively low negative voltage from a first negative charge pump (not shown) and a relatively high negative voltage from a second charge pump (not shown). The negative voltages are supplied to the switch 10 on a line HNIN. The output of the switch 10 is available at the OUTPUT node and its inverse is available at $\overline{\text{OUTPUT}}$ node. The circuit 10 receives the signal HNCASCBIAS for selectively switching relatively low and relatively high negative voltage levels.

The switch 10 may include a first pair of NMOS transistors 20 and 22 coupled in series. The transistors 20 and 22 may be NMOS transistors. Also coupled in series are a pair of NMOS transistors 24 and 26. Each pair of transistors 20 and 22 and 24 and 26 have a grounded deep N-well and the deep N-wells of each pair may be coupled together. In addition, each pair includes a P-well and those P-wells may be coupled together. The P-wells may be coupled to the input signal HNIN and each P-well may be coupled to the P-well of the other transistor of the pair. The gates of the transistors 20 and 24 are connected together and receive the input signal HNCASCBIAS.

The use of separate P-wells in the NMOS devices may lower well resistance by permitting well taps to be placed close to the transistor, and thus reduce the risk of snapback. It may further reduce the risk of snapback by providing a barrier to prevent impact ionization current from traveling from one transistor to another. The use of more than one cascode PMOS device in this may increase the output voltage capability relative to gate-aided drain breakdown voltage per unit of the PMOS devices. The use of more than one cascode NMOS device may increase output voltage capability relative to the snapback limit of NMOS devices.

The gate of the transistor 22 is connected to $\overline{\text{OUTPUT}}$, the gate of the transistor 26 is connected to OUTPUT and the gates of transistors 20, 24 are coupled. The transistors 20, 22, 24, and 26 may be triple well devices.

Figure 2:
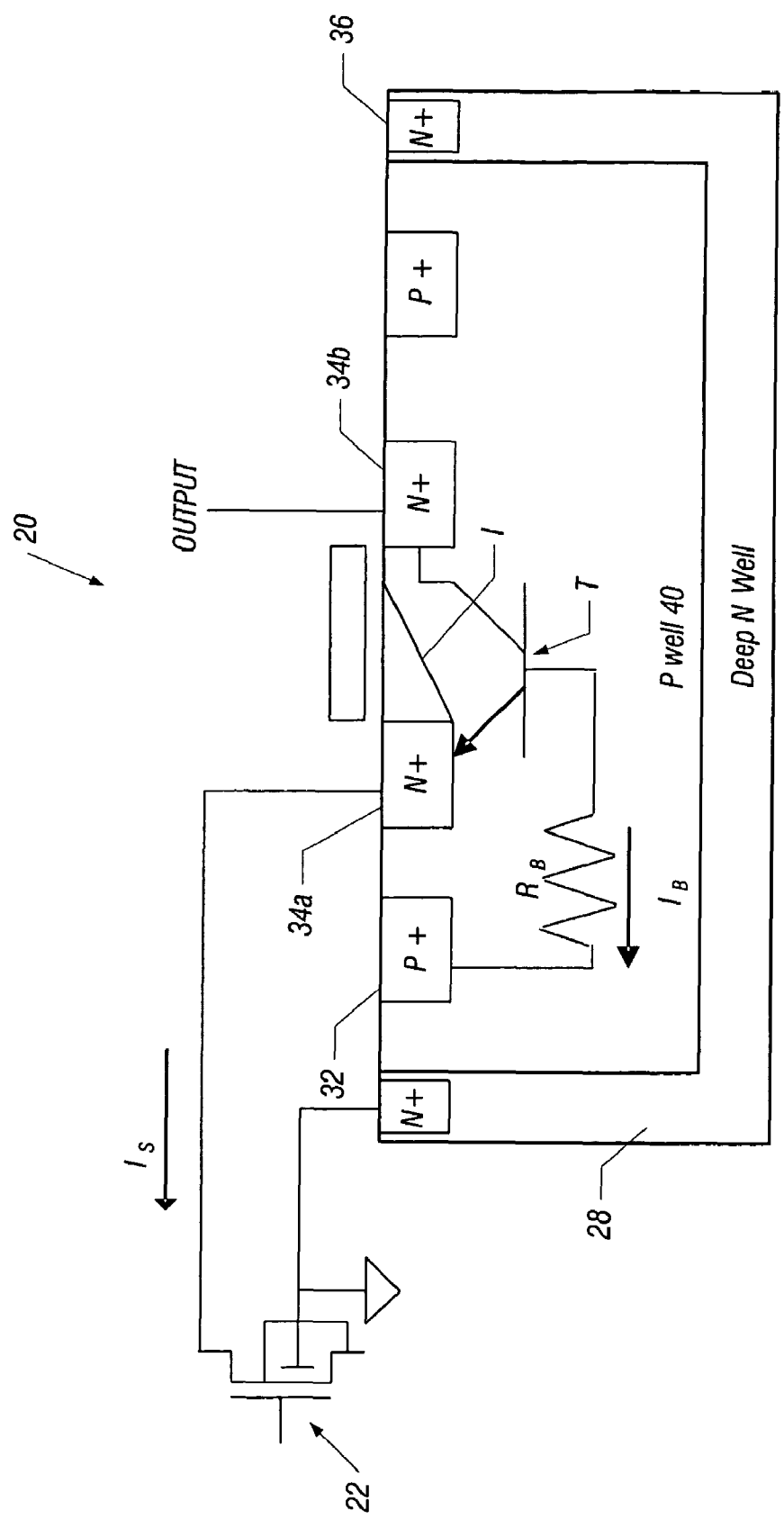
FIG. 2 is a schematic cross-sectional view through one of the devices shown in FIG. 1.

The configuration of the transistors 20 and 22 is shown in more detail in FIG. 2 and the devices 24 and 26 may be designed in a similar fashion. The drain of the transistor 22 is coupled to the source 34a of the transistor 20. The drain 34b of the transistor 20 is coupled to OUTPUT, which may have a voltage as high as the supply voltage VCC at the instance illustrated in FIG. 2. An effective transistor T is formed in the P-well 40 in which the transistor 20 is formed. The P-well 40 includes P-well contacts 32, which may be p+ regions. The P-well 40 is formed within a deep N-well 28, which includes contacts 36, which may be n+ regions. The deep N-well contacts 36 of the transistors 20 and 22 (and the devices 24 and 26) are coupled together and grounded.

In the configuration shown in FIG. 2, impact ionization I is developed in the channel between the source and drains 34. Impact ionization kicks off snapback. It occurs when there is a large amount of current and a large voltage across a transistor. A pinch off region forms in the channel between the source and drain 34 and electrons are accelerated to impact other electrons, forming a base current indicated as $I_B$ through an effective resistance $R_B$. This base current turns the device, T, on and the device runs out of control, providing current through the resistance $R_B$ and also the current $I_S$ through the device 22.

In some embodiments, the transistors 22 and 26 may be made relatively weak. As a result, they drive only low current, making them more resistive to the $I_S$ current, preventing snapback. The transistors 22 and 26 may have a longer length and a smaller width than the transistors 20 and 24, for example.

In one embodiment, each of the devices 20 and 24 is formed in its own separate deep N-well, such as the deep N-well 28. In the configuration shown in FIG. 1, the transistors 20 and 24 are cascode protection devices that protect the pass transistors 22 and 26. The transistors 20 and 24 protect the transistors 22 and 26 from the higher voltages at the nodes OUTPUT and $\overline{\text{OUTPUT}}$.

The switch 10 also includes a pair of PMOS passing transistors 12 and 14 which receive ENABLE and $\overline{\text{ENABLE}}$ signals on their gates. In one embodiment, the ENABLE and $\overline{\text{ENABLE}}$ signals are either zero or the supply voltage $V_{cc}$ which may be, for example, 1.8 volts.

The transistor 12 is coupled, at its drain, in series with the source of PMOS cascode protection transistor 16. Likewise, the transistor 14 is connected in the same fashion with PMOS cascode protection transistor 18. Each of the devices 12, 14, 16, and 18 may be formed in an N-well. The devices 16 and 18 may have their N-wells coupled to the nodes A and B, respectively.

Double cascoded protection is achieved because the devices 12 and 14 are protected by cascode protection devices 16, 18 and the devices 22 and 26 are protected by transistors 20 and 24 that act as cascode protection devices. This, in some embodiments, enables hot switching and extends the negative input range that would otherwise be limited by gate aided drain breakdown. If a device is off, a large field extending across its drain to gate may attract electrons, causing source-to-drain breakdown, so the gate no longer controls the device current. Gate aided drain breakdown generally happens in PMOS devices that are off. In contrast, snapback, illustrated in connection with the NMOS transistor 20 in FIG. 2, occurs in NMOS devices only. Snapback occurs as a result of a high gate-to-drain voltage and drain-to-source current, as may occur when NMOS devices are being switched.

When the transistor 12 is off because its ENABLE signal is high, the OUTPUT will be the HNIN large negative voltage. The transistor 16 provides gate aided breakdown protection to the transistor 12 by isolating the node A from the large negative voltage on the OUTPUT. Also, the transistor 16 may be protected from gate aided breakdown voltage by the discharge of its own N-well, which may also connect to the node A. In particular, node A may always be maintained above ground because the gate of transistor 16 is grounded. Thus, if the node A ever floated higher than a Vt above ground, it would be discharged through transistor 16 and so the node A remains in a floating state near ground.

The transistor 16 discharges node A to prevent negative voltage stress on its own drain. As a result, the transistor 16 is protected from gate aided drain breakdown. This is true even though the transistor 16 primarily functions to protect the transistor 12.

When the OUTPUT goes all the way to the lowest negative voltage, for example −9 volts, the gate of transistor 16 is grounded. If the transistor 16 were not there, the transistor 12 would have −9 volts on its drain and the supply voltage, such as 1.8 volts, on its gate and source which could lead to gate aided breakdown.

As a result, since HPIN is normally connected to the supply voltage, again, about 2 volts, this arrangement extends the allowed range by approximately the supply voltage. Stacking more p-type devices may further extend this limitation. That is, if the transistors 16 and 18 had another pair of p-type cascode protection devices on their drains, the negative voltage could go even lower. Additional PMOS devices may be protected from gate aided drain breakdown by biasing their gates with weak, negative lowering gate-to-drain voltage.

The transistors 20 and 24 are cascoded above the transistors 22 and 26. The transistors 20 and 24 have their gates biased with the signal HNCASCBIAS that may be adjusted for different input voltages. When the input voltage is very negative, HNCASCBIAS may be adjusted to some middle range. The transistors 20 and 24 and the transistors 16 and 18 are protecting each other from snapback during hot switching.

Since the transistors 20 and 22 are symmetrical with the transistors 24 and 26, only the transistors 20 and 22 are described for illustration purposes. When the input voltage HNIN is −9 volts, HNCASCBIAS may be adjusted to about −4.7 volts. The node C voltage will be much lower than HNCASCBIAS since there is current in the transistor 20 during switching. The transistor 22 will see low drain-to-source stress and will be free from snapback. The transistor 20 still sees very high drain-to-source voltage since its drain will be as high as the positive supply voltage, HPIN, while it source still remains negative.

Putting the devices 20 and 24 in their own deep N-wells and P-wells reduces the P-well resistance $R_B$. This provides a further barrier to current from hot electrons and hot holes. This current through the P-well resistance could induce a base voltage large enough to turn on the parasitic BJT, transistor T. By minimizing $I_b$ and $R_B$ at the same time, the voltage at the base of transistor T is less likely to be large enough to turn on the BJT, and the circuit 10 is more immune to snapback during hot switching. More stacking of N-type triple well cascode devices would allow the circuit 10 to hot switch with devices whose snapback limitation is an even lower proportion of HNIN.

In some embodiments, the negative input voltage range may be extended by providing cascode protection for gate aided drain induced breakdown. Moreover, in some embodiments, there may be no critical voltage window for positive supply voltages and the protection bias voltage does not consume current, so it is easier to design. In addition, the circuit can hot switch or toggle outputs with full voltage supply at a negative voltage greater than the individual device snapback limits.

In some cases, it is advantageous to use a single switch for both very high and ultra low negative voltage switching. The very high negative voltage may be greater than the snapback limit of a single NMOS passing transistor 22 or 26. The snapback limit, which arises with high voltages, is reached when the current through the device is no longer a function of the applied gate voltage. To enable hot switching when the relatively high supply voltage is already present, the cascode protection devices 20, 24 provide snapback protection. Thus, the embodiments of the present invention may be useful in switching voltages in excess of the snapback limit of devices 22, 26.

At other times, it may be desirable to pass a small negative voltage through the same switch. The voltage may be less than the threshold voltage of the NMOS passing devices 22, 26.

The cascode protection device 20 protects the NMOS passing device 22. For passing negative voltages that exceed the snapback limit of the device 22, the cascode protection device 20 is biased with a safe voltage HNCASCBIAS generated by the negative cascode bias generator 112 of FIG. 3. If the $V_{ds}$ snapback limit is less than the voltage passed from HNIN to OUTPUT, the bias generator 112 may be configured to bias the cascode protection device 20 in a way that provides snapback protection for the device 22. This may be done by lowering HNCASCBIAS.

For example, if the $V_{ds}$ snapback limit of the device 22 is 7 volts and the voltage passed to OUTPUT from HNIN is greater, for example, −8 volts, then the bias generator 112 may provide a bias (HNCASCBIAS) of about −4 volts. This −4 volts ensures that the voltage on the node C is no greater than about −4.7 volts when the device 20 has current flowing through it. The node C floats to a diode drop less than HNCASCBIAS. The $V_{ds}$ across device 22 is, therefore, limited to about 3.3 volts maximum, so it will not snapback. Similarly the $V_{ds}$ across device 20 may be VCC +4.7V. With a VCC of 2V, this will be 6.7V and will be below the 7V snapback limit.

In such case, OUTPUT may be driven to VCC through devices 12 and 16. In another example, where HNIN is −8 volts, HNCASCBIAS may be −4 volts and C may be −8 volts, while $V_{ds}$ for devices 20 and 22 may be zero volts, and the OUTPUT may be −8 volts.

For passing negative voltages that are smaller than the threshold voltages of the devices 20 or 22, the bias generator 112 may be reconfigured by a configuration signal to output a voltage to turn on the device 20. For example, the voltage HNCASCBIAS may be about 2 volts, as one example. Any voltage above the threshold voltage of the device 20 may be used, however. The device 20 no longer provides snapback protection for the device 22 but, of course, such protection may not be needed if the passing voltages are below the voltage drain to source snapback limit. The higher gate drive on device 24 can also be used to lower the resistance of the switch passing the negative voltage.

As an example, if HNIN is a small value negative voltage, such as −0.2 volts, that OUTPUT is not pulled up to VCC by devices 12 and 16, so that OUTPUT is −0.2 volts, while HNCASCBIAS may be 2 volts and the drain to source voltage of the device 22 is zero. In the case where the output is not pulled up by devices 12 and 16, the node C is at OUTPUT and, in the case where OUTPUT is −0.2 volts, the node C may be −0.2 volts. Thus, the bias of HNCASCBIAS may be raised to turn on the device 20 if the path is selected and a very low voltage is supplied on the input HNIN.

Figure 3:
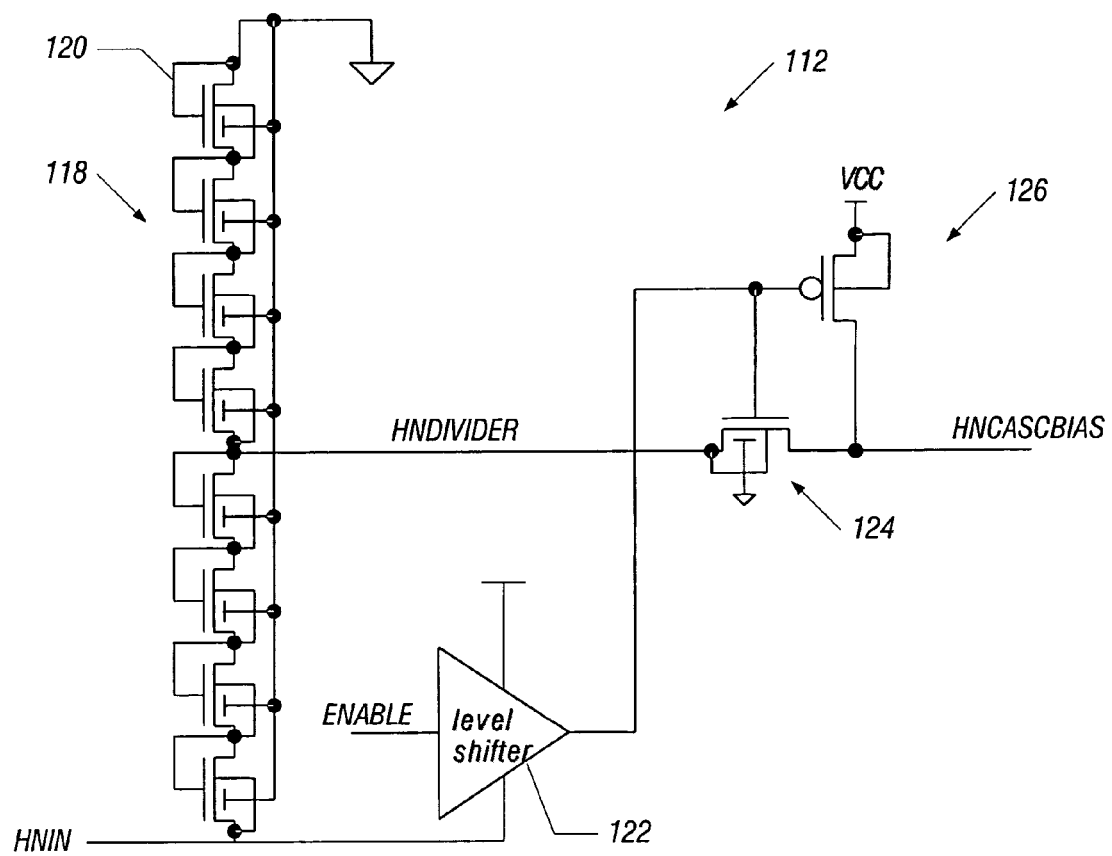
FIG. 3 is a circuit diagram showing one possible implementation of a negative cascode bias generator to generate the signal HNCASCBIAS of FIG. 1 in accordance with one embodiment of the present invention.

Referring to FIG. 3, an implementation of a bias generator 112 for supplying the signal HNCASCBIAS includes a voltage divider 118 which provides an output voltage HNDIVIDER. The upper end of the voltage divider 118 is grounded and includes four diode connected active devices 120. The lower end includes four diode connected active devices 120 coupled to HNIN. Coupled to HNIN is a level shifter 122 with an enable input. Level shifter 122 is coupled to the gate of a PMOS transistor 126 which also receives a supply voltage on its source while its drain is coupled to HNCASCBIAS. Coupled to HNDIVIDER is an NMOS transistor 122 with its drain coupled to HNCASCBIAS and its gate controlled by the output from the level shifter 122.

When enabling larger negative voltages, the enable signal on the level shifter 122 is brought high. The level shifter 122 passes a voltage from the divider 118 using diode connected active devices 120. Other ways of implementing the lower voltage may also be used, including a resistor divider or a separate voltage supply. A voltage is selected as the output of the voltage divider 118 that will guarantee that the device 16 will not snapback if switched. Thus, in this case, with where VNN is −8 volts, the voltage divider 118 provides an output signal HNDIVIDER of −4 volts.

The signal HNDIVIDER is provided on the source of the transistor 124 while its gate is turned on so that the HNDIVIDER is passed as HNCASCBIAS.

When passing lower voltages through the negative switch 10, the enable signal on the level shifter 122 is brought low. The low output from the level shifter 122 turns off the passing device 124 by removing its gate drive and turns on the device 126. Thus, HNDIVIDER is isolated from the output HNCASCBIAS and the output, instead, is provided by the supply voltage $V_{cc}$. The voltage $V_{cc}$ may be set high enough so that the device 20, in FIG. 1, will pass any small negative voltage. HNDIVIDER may float in this implementation but may stay between zero volts and HNIN, so that it will not forward bias the wells of the devices 124 or 118.

Thus, in some embodiments, hot switching may be possible where a voltage is passed without first lowering the supply and a negative voltage greater than the individual device snapback on that device may be permitted. At a different time, the switch 10 can pass a small negative voltage, which may or may not be lower than the threshold voltage of an individual device, or configure it as low resistance through increased gate drive. Thus, a dual mode switch may be implemented in some embodiments.

While the present invention is applicable in flash memories as described hereinafter, it may also have applicability in other negative switching environments. Thus, the present invention is not necessarily limited to flash embodiments. Passing devices of increased gate drive are used throughout the industry to pass low voltages through NMOS devices.

In some embodiments, triple, quadruple, or n-tuple cascading may be used. Triple or higher cascading may be used, for example, if the voltage to be passed is greater than twice the voltage of a single device's breakdown voltage. If all the cascode devices' gates are tied to a high enough (positive) voltage, then a low negative voltage can pass through all of them.

Figure 4:
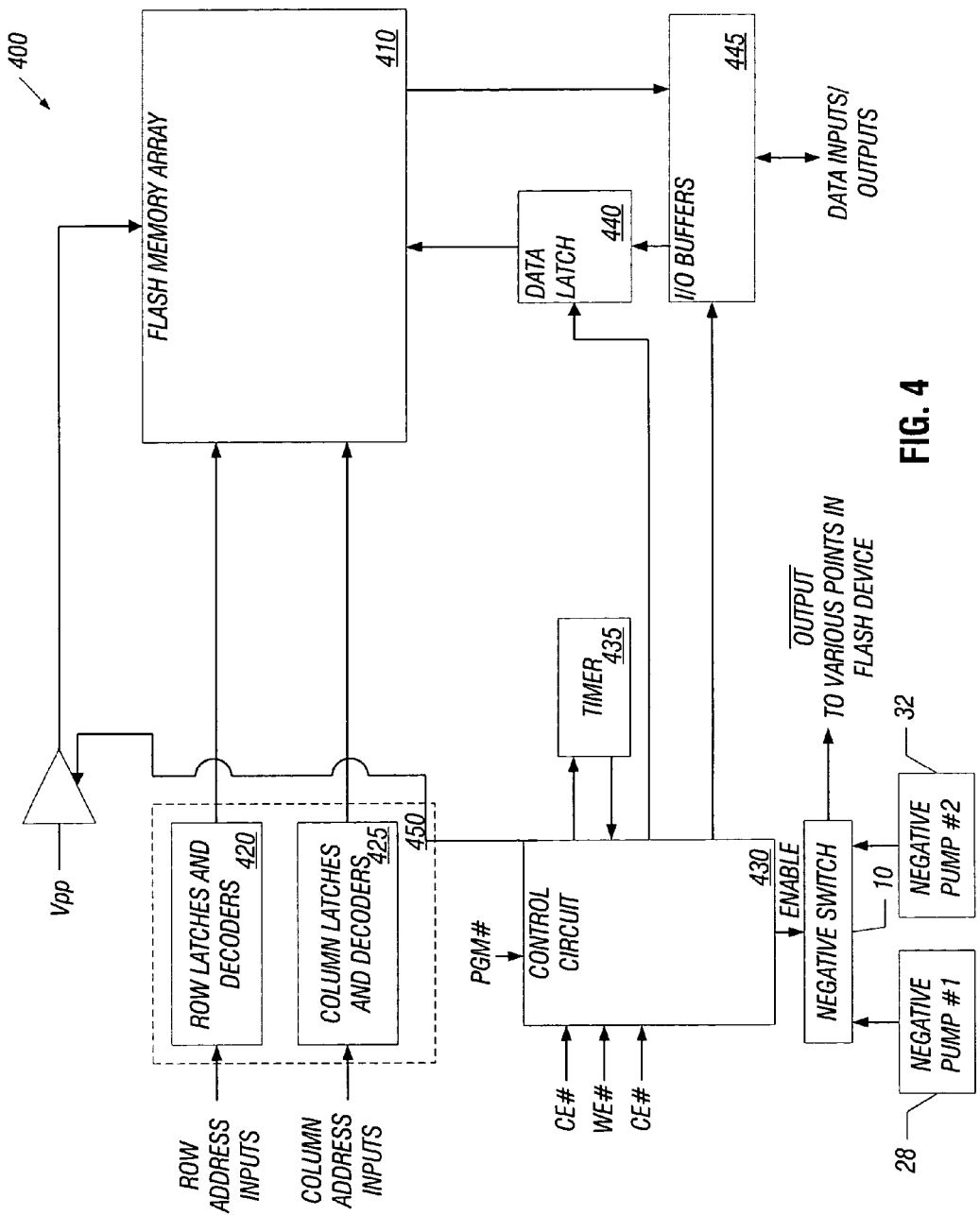
FIG. 4 is a circuit diagram for a flash memory in accordance with one embodiment of the present invention.

Referring to FIG. 4, in a flash memory 400, the flash memory cells within a flash memory array 410 are addressed by decoding circuit 450 which includes the row latches and decoders 420 and the column latches and decoders 425. The row latches and decoders 420 receive the row address inputs and the row latches and decoders 425 receive the column address inputs. The flash memory device 400 may incorporate the switch circuit 10 in its periphery in one embodiment.

The control circuit 430 receives the various control signals, such as a chip enable signal CE#, a write enable signal WE#, an output enable signal OE#, and a program control circuit PGM#. The addressing circuit 450, the control circuit 430, and the timer 435 may be used to control the reading, writing, and erasing of flash memory cells.

Data is input and output from the flash memory device 400 via the input/output (I/O) buffers 445. Input data is latched in the flash memory array 410 by the data latch 440, which may be controlled by the control circuit 430.

The control circuit 430 may supply the configuration signal to the negative switch 10. The negative switch 10 receives, as HNIN, the signals from a first negative charge pump 28 and a second negative charge pump 32. The switch 10 outputs the signals OUTPUT and $\overline{\text{OUTPUT}}$ to various circuits within the flash memory that need relatively high or low negative voltage.

If the memory array is divided into memory blocks, then the row latches and decoders 420 may also include the block latches and decoders.

Figure 5:
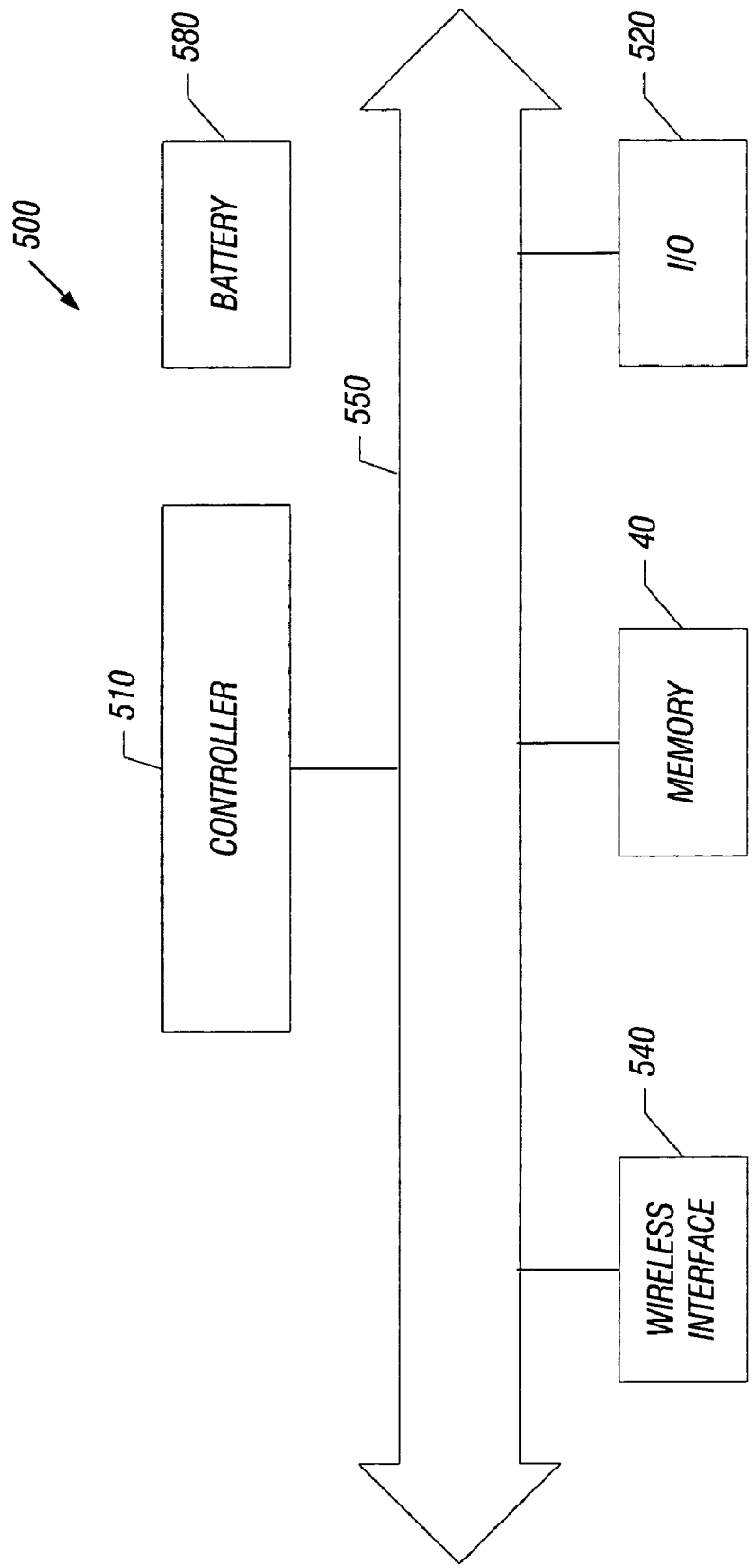
FIG. 5 is a system depiction in accordance with one embodiment of the present invention.

Referring to FIG. 5, the flash memory device 400 may be used in various types of computer systems 500. The computer system 500, within which the flash memory drives 400 is used, can be, as examples, a personal computer, a notebook computer, a laptop computer, a personal digital assistant, a minicomputer, a work station, a mainframe, a multiprocessor, a camera, a cell phone, or other devices.

The system 500 may include a controller 510. The controller 510 may, for example, be a microcontroller, a microprocessor, multiple microprocessors, or a digital signal processor. The system 500 may be powered by a battery 580, in one embodiment, although the present invention is not so limited.

The controller 510 is coupled to a bus 550 which connects to additional components including a wireless interface 540, the memory 400, and input/outputs 520. The input/outputs (I/O) 520 may be any conventional input/output device including a display, a touchpad, a keyboard, or a mouse, to mention a few examples. The wireless interface 540 may enable any wireless standard including cellular telephone communications or wireless network communications, as two examples. In one embodiment, the wireless interface 540 may be a dipole antenna.

While the present invention is not limited to wireless applications, in a wireless application, the memory 400 may, for example, store messages that are communication from the system 500 and received thereby.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing positive and negative voltage sources to a switch;
   providing a first pass device and a first cascode protection device on said negative voltage source and a second pass device and a second cascode protection device on the positive voltage source; and
   selectively providing an output voltage from one of said sources, between said first and second cascode protection devices.

2. The method of claim 1 including providing a PMOS second pass device and an NMOS first pass device.

3. The method of claim 1 including providing a PMOS second pass device with a grounded gate.

4. The method of claim 1 including providing an NMOS first cascode protection device and an NMOS first pass device, said NMOS first cascode protection device and said NMOS first pass device having deep N-wells that are grounded.

5. The method of claim 4 including providing P-wells for said NMOS first pass device and NMOS first cascode protection device and coupling said P-wells together.

6. The method of claim 1 including providing a PMOS second pass device and a PMOS second cascode protection device and coupling a P-well of said PMOS second cascode protection device to a node between said PMOS second pass device and said PMOS second cascode protection device.

7. The method of claim 1 including providing a third pass device coupled to said negative voltage source, and a third cascode protection device coupled to said third pass device.

8. The method of claim 7 including providing NMOS third pass and cascode protection devices coupled to said negative voltage source and PMOS fourth pass and cascode protection devices coupled to said positive voltage source.

9. The method of claim 7 including providing an output between said first and second cascode protection devices and the inverse of said output between said third and fourth cascode protection devices.

10. The method of claim 8 including making said NMOS first and third pass devices weaker than said NMOS first and third cascode protection devices.

11. A voltage switch comprising:
    a series coupled first pass device and first cascode protection device connectable to a negative voltage source;
    a series coupled second pass device and second cascode protection device connectable to a positive voltage source; and
    a circuit to selectively provide an output voltage from one of said sources, between said first and second cascode protection devices.

12. The switch of claim 11 wherein said second pass device is a PMOS device and said first pass device is an NMOS device.

13. The switch of claim 11 wherein said second pass device is a PMOS device with a grounded gate.

14. The switch of claim 11 wherein said first cascode protection device is an NMOS device and said first pass device is an NMOS device, said NMOS first cascode protection device and said NMOS first pass device having deep N-wells that are grounded.

15. The switch of claim 14 including an NMOS first pass device and an NMOS first cascode protection device having P-wells that are coupled together.

16. The switch of claim 11 including a second pass device that is a PMOS device, a second cascode protection device that is a PMOS device, said devices having P-wells, said P-well of said PMOS second cascode protection device coupled between the PMOS second pass device and said PMOS second cascode protection device.

17. The switch of claim 11 including a third pass device connectable to a negative voltage source and a third cascode protection device coupled to said third pass device.

18. The switch of claim 17 including a third pass and cascode protection devices that are NMOS devices, said devices connectable to a negative voltage source, and a fourth pass and a fourth cascode protection device that are PMOS devices that are connectable to a positive voltage source.

19. The switch of claim 18 including an output between said first and second cascode protection devices and an inverse of the output between said third and fourth cascode protection devices.

20. The switch of claim 18 wherein said NMOS first and third pass devices are weaker than said NMOS first and third cascode protection devices.

21. The switch of claim 18 including a flash memory.

22. A processor-based system comprising:
    a processor;
    a wireless interface coupled to said processor;
    a series coupled first pass device and first cascode protection device;
    a series coupled second pass device and second cascode protection device;
    a first voltage source;
    a second voltage source; and
    a circuit to selectively provide an output voltage from one of said sources, between said first and second cascode protection devices.

23. The system of claim 22 including a flash memory array coupled to said first and second pass devices.

24. The system of claim 23 including a dipole antenna.

25. The system of claim 22 wherein said second pass device is a PMOS device and said first pass device is an NMOS device.

26. The system of claim 22 wherein said second pass device is a PMOS device with a grounded gate.

27. The system of claim 22 wherein said first cascode protection device is an NMOS device and said first pass device is an NMOS device, said NMOS first cascode protection device and said NMOS first pass device having deep N-wells that are grounded.

28. The system of claim 27 including an NMOS first pass device and an NMOS first cascode protection device having P-wells that are coupled together.

29. The system of claim 22 including a second pass device that is a PMOS device, a second cascode protection device that is a PMOS device, said devices having P-wells, said P-well of said PMOS second cascode protection device coupled between the PMOS second pass device and said PMOS second cascode protection device.

30. The system of claim 22 including a third pass device connected to said first voltage source which is a negative voltage source and a third cascode protection device coupled to said third pass device.

* * * * *